(12) United States Patent
Matsushima et al.

(10) Patent No.: US 8,742,416 B2
(45) Date of Patent: Jun. 3, 2014

(54) DISPLAY PANEL, METHOD OF MANUFACTURING DISPLAY PANEL, DISPLAY DEVICE, AND ELECTRONIC APPARATUS

(75) Inventors: Toshiharu Matsushima, Tottori (JP); Shinichiro Nomura, Tottori (JP)

(73) Assignee: Sony Corporation (JP)

( * ) Notice: Subject to any disclaimer, the term of this patent is extended or adjusted under 35 U.S.C. 154(b) by 148 days.

(21) Appl. No.: 13/276,762

(22) Filed: Oct. 19, 2011

(65) Prior Publication Data
US 2012/0138939 A1 Jun. 7, 2012

(30) Foreign Application Priority Data

Dec. 1, 2010 (JP) ................................. 2010-268044

(51) Int. Cl.
*H01L 29/04* (2006.01)
*H01L 29/10* (2006.01)
*H01L 31/00* (2006.01)

(52) U.S. Cl.
USPC .. 257/59; 438/30; 257/E33.066; 257/E27.121

(58) Field of Classification Search
None
See application file for complete search history.

(56) References Cited

U.S. PATENT DOCUMENTS

| 2002/0041354 A1 | 4/2002 | Noh et al. |
| 2008/0158457 A1 | 7/2008 | Park et al. |
| 2010/0289977 A1* | 11/2010 | Liu .................................. 349/44 |

FOREIGN PATENT DOCUMENTS

| JP | 2002-182230 | 6/2002 |
| JP | 2008-052161 | 3/2008 |
| JP | 2008-165230 | 7/2008 |

* cited by examiner

*Primary Examiner* — Sonya D McCall Shepard
(74) *Attorney, Agent, or Firm* — Sheridan Ross P.C.

(57) ABSTRACT

A display panel includes: gate lines disposed on a first substrate; signal lines extending across the gate lines and including portions, other than portions thereof that extend across the gate lines, disposed on the same surface as the gate lines, the portions that extend across the gate lines being disposed in positions facing the gate lines with an insulating film interposed therebetween; transistors having gate electrodes connected to the gate lines, source electrodes connected to the signal lines and disposed on the insulating film, and drain electrodes disposed on the insulating film; pixel electrodes connected to the drain electrode and disposed on the insulating film; a protective film covering the transistors and the pixel electrodes; and a common electrode disposed on the protective film.

18 Claims, 13 Drawing Sheets

DISPLAY PANEL, METHOD OF MANUFACTURING DISPLAY PANEL, DISPLAY DEVICE, AND ELECTRONIC APPARATUS

CROSS REFERENCES TO RELATED APPLICATIONS

The present application claims priority to Japanese Patent Application No. 2010-268044 filed on Dec. 1, 2010, the disclosure of which is incorporated herein by reference.

BACKGROUND

The present disclosure relates to a display panel capable of controlling the orientation of liquid crystal molecules with a horizontal electric field, and a method of manufacturing such a display panel. The present disclosure is also concerned with a display device and an electronic apparatus which incorporate the above display panel.

At present, liquid crystal panels are widely used in mobile devices such as mobile phones and laptop personal computers. One type of liquid crystal panels that has heretofore been popular in the art is a vertical-electric-field liquid crystal panel exemplified by liquid crystal panel using a TN (Twisted Nematic) liquid crystal. The vertical-electric-field liquid crystal panel displays an image based on a change in the light transmittance of the panel which depends on the orientation of liquid crystal molecules when the liquid crystal molecules are oriented in the direction of an electric field that is applied perpendicular to the substrate of the panel.

However, the vertical-electric-field liquid crystal panel has been problematic in that it provides a small viewing angle because the observer sees liquid crystal molecules in different directions if they see the display surface of the liquid crystal panel at different angles. One solution to the problem has been proposed by a horizontal-electric-field liquid crystal panel as disclosed in Japanese Patent Laid-Open No. 2002-182230.

The horizontal-electric-field liquid crystal panel displays an image based on a change in the light transmittance of the panel which depends on the rotation of liquid crystal molecules when the liquid crystal molecules are rotated in a plane parallel to the surface of the substrate of the panel by an electric field that is applied parallel to the substrate. The horizontal-electric-field liquid crystal panel provides a wide viewing angle because the observer sees liquid crystal molecules in one direction even if they see the display surface of the liquid crystal panel at different angles.

Horizontal electric fields may be generated by an FFS (Fringe Field Switching) mode (Japanese Patent Laid-Open Nos. 2008-52161 and 2008-165230 (hereinafter referred to as Patent Documents 1 and 2)) and an IPS (In-Plane Switching) mode. According to the latter IPS mode, an electric field is mainly generated only in a horizontal direction parallel to the substrate surface, but is less liable to be generated in a region above pixel electrodes. Therefore, since only liquid crystal molecules that are present between adjacent pixel electrodes are driven, the liquid crystal panel tends to have a low aperture ratio. According to the former FFS mode, a horizontal electric field is generated between pixel electrodes, and a horizontal oblique electric field or a parabolic electric field is generated in a region above pixel electrodes. Therefore, not only liquid crystal molecules that are present between adjacent pixel electrodes, but also liquid crystal molecules that are present above pixel electrodes are sufficiently driven. Consequently, the FFS mode provides a higher aperture ratio than the IPS mode.

SUMMARY

Patent Document 1, for example, discloses that in order to increase the aperture ratio and reduce the number of fabrication steps for FFS-mode liquid crystal panels, pixel electrodes are formed in the same plane as the drain electrodes of TFT (Thin Film Transistor) devices and a common electrode is formed in a planar pattern fully over a display area including an area facing the pixel electrodes. However, the approach taken by Patent Document 1 is disadvantageous in that since signal lines are in the same plane as the pixel electrodes, an interconnect capacitance developed between the signal lines and the common electrode tends to be large.

Patent Document 2 discloses that a layer between the signal lines and the common electrode is made thicker thereby to reduce an interconnect capacitance developed between the signal lines and the common electrode. However, the thicker layer increases the distance between the pixel electrodes and the common electrode, resulting in an increase in a voltage required to drive the pixel electrodes.

Accordingly, it is desirable to provide a display panel capable of lowering a voltage required to drive pixel electrodes and also reducing an interconnect capacitance developed between signal lines and a common electrode, and a method of manufacturing such a display panel.

It is also desirable to provide a display device and an electronic apparatus which incorporate the above display panel.

A display panel according to an embodiment of the present disclosure includes gate lines disposed on a first substrate, signal lines extending across the gate lines and including portions, other than portions thereof that extend across the gate lines, disposed on the same surface as the gate lines, the portions that extend across the gate lines being disposed in positions facing the gate lines with an insulating film interposed therebetween, transistors having gate electrodes connected to the gate lines, source electrodes connected to the signal lines and disposed on the insulating film, and drain electrodes disposed on the insulating film, pixel electrodes connected to the drain electrode and disposed on the insulating film, a protective film covering the transistors and the pixel electrodes, and a common electrode disposed on the protective film.

A display device according to an embodiment of the present disclosure includes the above display panel as a display unit. An electronic apparatus according to an embodiment of the present disclosure includes the above display device.

In the display panel, the display device, and the electronic apparatus according to the embodiments of the present disclosure, the portions of the signal lines, other than the portions thereof that extend across the gate lines, and the pixel electrodes are disposed on different surfaces. Therefore, the portions of the signal lines other than the portions thereof that extend across the gate lines and the common electrode can be spaced away from each other by increasing the thickness of the insulating film, and the pixel electrodes and the common electrode can be brought closely to each other by reducing the thickness of the protective film. In other words, according to the embodiments of the present disclosure, the distance between the portions of the signal lines other than the portions thereof that extend across the gate lines and the common electrode, and the distance between the pixel electrodes and the common electrode can be adjusted independently of each other.

A method of manufacturing a display panel according to an embodiment of the present disclosure includes the following five steps:

(A1) the step of forming gate lines and a plurality of partial signal lines extending in a direction to extend across the gate lines, on one surface of a substrate;

(A2) the step of forming an insulating film on the surface with the gate lines and the partial signal lines formed thereon, the insulating film having a plurality of openings defined therein through which the surfaces of portions of the partial signal lines near the gate lines are exposed;

(A3) the step of forming junctions interconnecting adjacent ones of the partial signal lines through the openings, and forming source electrodes held in contact with the junctions and drain electrodes separate from the source electrodes on the insulating film;

(A4) the step of forming pixel electrodes held in contact with the drain electrodes on the insulating film, and thereafter forming a protective film covering the source electrodes, the drain electrodes, and the pixel electrodes; and (A5) forming a common electrode on the protective film.

A method of manufacturing a display panel according to a reference example includes the following five steps:

(B1) the step of forming gate lines on a substrate;

(B2) the step of forming an insulating film on a surface with the gate lines formed thereon, the insulating film having a plurality of openings in areas thereof, other than areas thereof which extend across the gate lines, among areas in which a plurality of signal lines are to be formed so as to extend in a direction across the gate lines;

(B3) the step of forming source electrodes extending from the bottoms of the openings to the surfaces of areas of the insulating film which face the gate lines, and forming drain electrodes which are separate from the source electrodes on the insulating film;

(B4) forming pixel electrodes held in contact with the drain electrodes on the insulating film, and thereafter forming a protective film covering the source electrodes, the drain electrodes, and the pixel electrodes; and (B5) the step of forming a common electrode on the protective film.

In the method of manufacturing a display panel according to the embodiment of the present disclosure and the method of manufacturing a display panel according to the reference example, the partial signal lines, i.e., the portions of signal lines other than portions thereof that extend across the gate lines, and the pixel electrodes are disposed on different surfaces. Therefore, the partial signal lines and the common electrode can be spaced away from each other by increasing the thickness of the insulating film, and the pixel electrodes and the common electrode can be brought closely to each other by reducing the thickness of the protective film. In other words, according to the embodiment of the present disclosure and the reference example, the distance between the partial signal lines, i.e., the portions of signal lines other than portions thereof that extend across the gate lines and the common electrode, and the distance between the pixel electrodes and the common electrode can be adjusted independently of each other.

With the display panel, the display device, and the electronic apparatus according to the embodiments of the present disclosure, and also with the method of manufacturing a display panel according to the embodiment of the present disclosure and the method of manufacturing a display panel according to the reference example, the distance between the portions of signal lines other than portions thereof that extend across the gate lines, i.e., the partial signal lines, and the common electrode, and the distance between the pixel electrodes and the common electrode can be adjusted independently of each other. As a consequence, it is possible to reduce the interconnect capacitance developed between the signal lines and the common electrode, and at the same time to reduce the voltage required to drive the pixel electrodes.

Additional features and advantages are described herein, and will be apparent from the following Detailed Description and the figures.

DETAILED DESCRIPTION

Embodiments of the present application will be described below in detail with reference to the drawings.

The present disclosure will be described according to the following sequence:

1. Exemplary Embodiment:
Signal lines are formed in a plurality of steps (FIGS. 1 through 11A and 11B).
2. Modifications:
Signal lines are formed altogether in one step (FIGS. 12A and 12B through 19A and 19B).
No structure is specified, but only numerical values are limited (FIG. 20).
3. Application:
The display devices according to the exemplary embodiment and the modifications are applied to an electronic device (FIG. 21).

Figure 1:
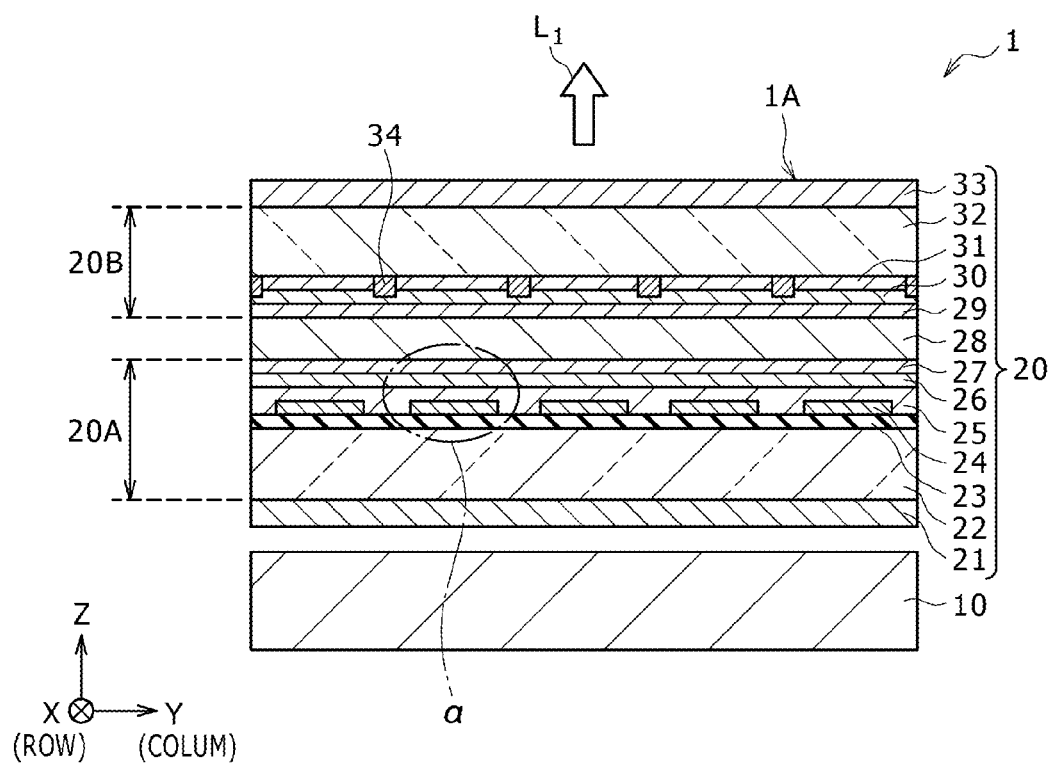
FIG. 1 is a cross-sectional view showing a configurational example of a display device according to an embodiment of the present disclosure.
Figure 2:
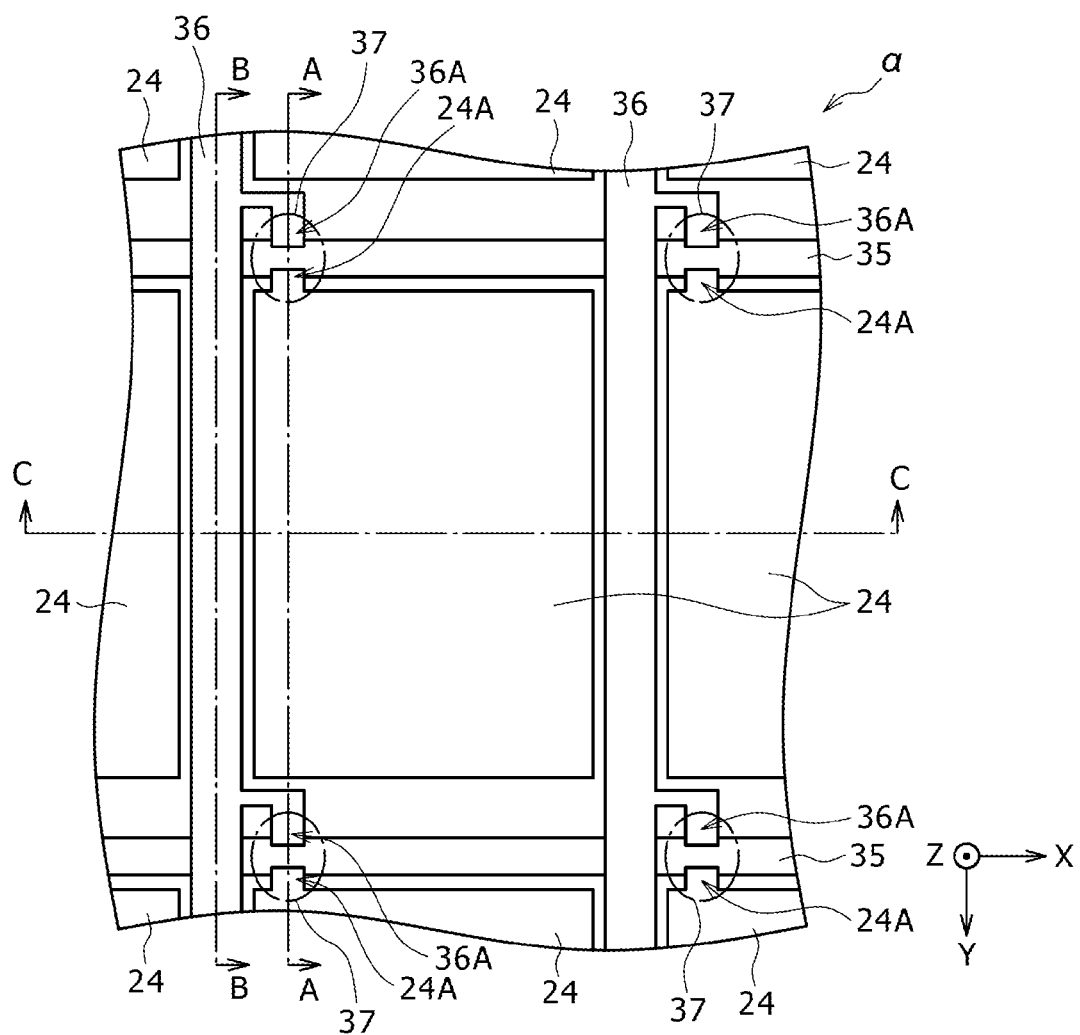
FIG. 2 is an enlarged fragmentary plan view of the display device shown in FIG. 1.

1. Exemplary Embodiment:

FIG. 1 shows a sectional configurational example of a display device 1 according to an embodiment of the present disclosure. FIG. 2 shows a planar configurational example of a portion of the display device 1 shown in FIG. 1 which includes a pixel and a nearby region (area α in FIG. 1). In FIGS. 1 and 2, the display device 1 is schematically illustrated to dimensions and shapes which may not necessarily be identical to actual dimensions and shapes.

The display device 1 incorporates a horizontal-electric-field liquid crystal panel, or more specifically, an FFS-mode liquid crystal panel. As shown in FIG. 1, the display device 1 includes a backlight 10, a liquid crystal panel 20 disposed above the backlight 10, and a driver circuit, not shown, for driving the backlight 10 and the liquid crystal panel 20.

The backlight 10 illuminates the rear surface of the liquid crystal panel 20. The backlight 10 is an edge-lit planar light-emitting source which includes a light guide plate, a light source disposed on a side of the light guide plate, a reflecting plate disposed behind the light guide plate, and a diffusing plate disposed on an upper surface of the light guide plate, not shown. Alternatively, the backlight 10 may be a direct-lit planar light-emitting source which includes a light source, a reflecting plate disposed behind the light source, and a diffusing plate disposed above the light source, not shown. If necessary, the reflecting plate and the diffusing plate may be dispensed with, and other optical elements may be added to the backlight 10.

The liquid crystal panel 20 modulates light emitted from the backlight 10 with a video signal to generates image light $L_1$ and outputs the image light $L_1$ from a video display surface 1A thereof. As shown in FIG. 1, the liquid crystal panel 20 is of a stacked structure including a lower panel substrate 20A near the backlight 10, an upper panel substrate 20B near the video display surface 1A, and a liquid crystal layer 28 sandwiched between the lower panel substrate 20A and the upper panel substrate 20B. The liquid crystal panel 20 also includes a pair of polarizer plates 21, 33 disposed respectively on a reverse surface of the lower panel substrate 20A and an upper surface of the upper panel substrate 20B.

As shown in FIG. 1, the liquid crystal panel 20 further includes a translucent substrate 22 on the upper surface of the polarizer plate 21, an insulating film 23, pixel electrodes 24, a protective film 25, a common electrode 26, an orientation film 27 on the lower surface of the liquid crystal layer 28, an orientation film 29 on the upper surface of the liquid crystal layer 28, an overcoat layer 30, color filters 31, and a translucent substrate 32 on the lower surface of the polarizer plate 33, which are successively arranged in the order named from the backlight 10. The liquid crystal panel 20 also includes light-blocking films 34 disposed in the same plane as the color filters 31 and alternating with the color filters 31. The translucent substrate 22, the insulating film 23, the pixel electrodes 24, the protective film 25, the common electrode 26, and the orientation film 27 jointly make up the lower panel substrate 20A. The orientation film 29, the overcoat layer 30, the color filters 31, the translucent substrate 32, and the light-blocking films 34 jointly make up the upper panel substrate 20B.

The polarizer plates 21, 33 function as a type of optical shutter for passing only light (polarized light) which oscillates in a certain direction. The polarizer plates 21, 33 have respective polarizing axes (transmitting axes) angularly spaced from each other by 90 degrees for selectively transmitting the light from the backlight 10 through the liquid crystal layer 28 or blocking the light from the backlight 10. The transmitting axis of either one of the polarizer plates 21, 33 lies parallel to the direction in which the orientation films 27, 29 are rubbed.

Figure 3:
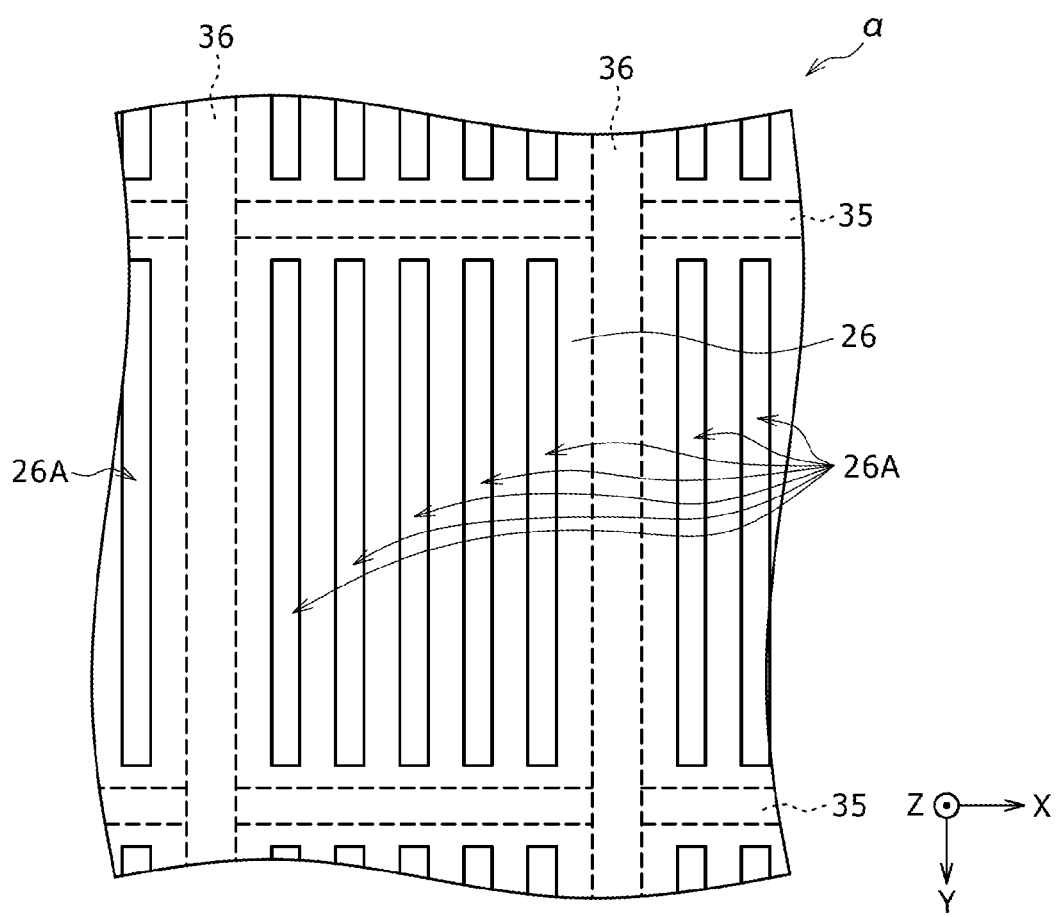
FIG. 3 is an enlarged fragmentary plan view of a common electrode of the display device shown in FIG. 1.

Each of the translucent substrates 22, 32 is a substrate that is transparent to visible light, e.g., a sheet of glass or a translucent resin substrate. The pixel electrodes 24 and the common electrode 26 are made of an electrically conductive material that is transparent to visible light, e.g., ITO (Indium Tin Oxide). The pixel electrodes 24 are arranged in a regular pattern on the insulating film 23, and function as electrodes for respective dots or pixels. The pixel electrodes 24 may be arranged in a grid pattern or a delta pattern. Each of the pixel electrodes 24 is of a rectangular shape, as shown in FIG. 2. The common electrode 26 is positioned closer to the liquid crystal layer 28 than the pixel electrodes 24. Specifically, the common electrode 26 is disposed on the protective film 25 which covers the pixel electrodes 24. The common electrode 26 is positioned in confronting relation to the pixel electrodes 24 with the protective film 25 interposed therebetween, and extends in a planar shape over the protective film 25 in its entirety, or more specifically, over an entire display area provided by the pixel electrodes 24. Therefore, the common electrode 26 functions as a common electrode which faces the pixel electrodes 24. As shown in FIG. 3, the common electrode 26 has a plurality of openings 26A defined in areas thereof which the pixel electrodes 24, respectively. Each of the openings 26A is of a rectangular shape extending in a Y-axis direction, for example, as a slit. Alternatively, each of the openings 26A may extend in any directions other than the Y-axis direction. The pixel electrodes 24 and the common electrode 26 will further be described below in connection with TFT devices 37.

The insulating film 23 functions as a gate insulating film of the TFT devices 37 to be described later. The insulating film 23 has a thickness of about 400 nm (4000 angstrom), for example. The protective film 25, which protects the TFT devices 37 and the pixel electrodes 24, is made of an inorganic insulating material which is translucent and insulative, e.g., silicon nitride (SiN) and silicon oxide ($SiO_2$).

If the protective film 25 is made of silicon nitride having a dielectric constant of 6.5, then the total thickness of the insulating film 23 and the protective film 25 should preferably be of 600 nm (6000 angstrom) or higher in order to reduce an interconnect capacitance developed between source lines 36, to be described later, and the common electrode 26 through the insulating film 23 and the protective film 25. If the protective film 25 is too thick, then it is not easy to form openings 23A, to be described later, therein in a fabrication process. Therefore, the protective film 25 should preferably have a thickness of 400 nm (4000 angstrom) or smaller. Specifically, the thickness of the protective film 25 should preferably be in the range from 200 nm (2000 angstrom) to 400 (4000 angstrom) for the reduction of an interconnect capacitance developed between the source lines 36 and the common electrode 26 and the ease with which to form the openings 23A in the protective film 25. The thickness of the protective film 25 is the same as or smaller than the thickness of the insulating film 23.

The orientation films 27, 29 serve to orient liquid crystal molecules. The orientation films 27, 29 are made of a polymeric material such as polyimide or like. The orientation films 27, 29 are produced by rubbing a coated layer of polyimide or the like. The liquid crystal layer 28, which is made of a nematic liquid crystal, has a modulating function to selectively transmit or block light emitted from the backlight 10 per pixel depending on a voltage applied from the driver circuit. The gradation of each pixel is adjusted by changing the light transmission level of the liquid crystal. If the liquid crystal layer 28 is made of a nematic liquid crystal having a negative dielectric constant anisotropy, then the rubbing direction of the orientation films 27, 29 extends parallel to the Y-axis direction in FIG. 1. If the liquid crystal layer 28 is made of a nematic liquid crystal having a positive dielectric constant anisotropy, then the rubbing direction of the orientation films 27, 29 extends parallel to an X-axis direction in FIG. 1.

The color filters 31 separate light which has passed through the liquid crystal layer 28 into lights of three primaries of red (R), green (G), and blue (B), or into lights of four colors of R, G, B, and white (W). The color filters 31 are arranged in a pattern corresponding to the pattern of the pixel electrodes 24. The color filters 31 may be arranged in a striped pattern, a diagonal pattern, a delta pattern, or a rectangular pattern. The light-blocking films 34, which reduce crosstalk between the pixels, have a function to absorb visible light, for example. The light-blocking films 34 are disposed in areas out of alignment with the pixel electrodes 24, and are arranged in a grid pattern having openings aligned with the pixel electrodes 24.

Figure 4A:
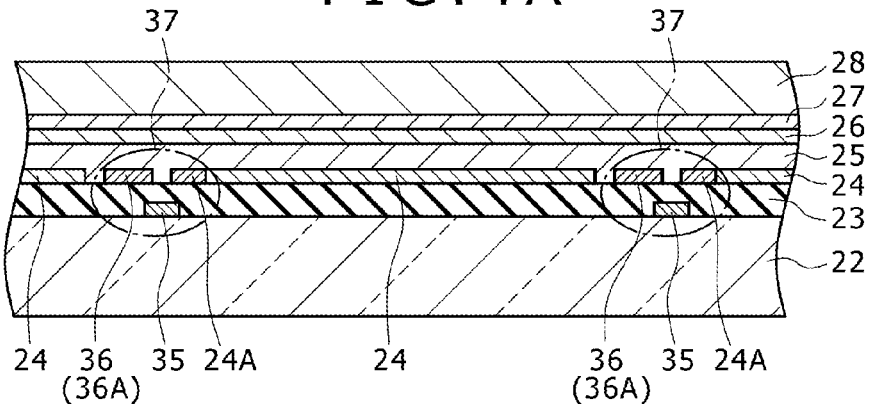
FIGS. 4A and 4B are fragmentary cross-sectional views taken along lines A-A and B-B, respectively, of FIG. 2.
Figure 4B:
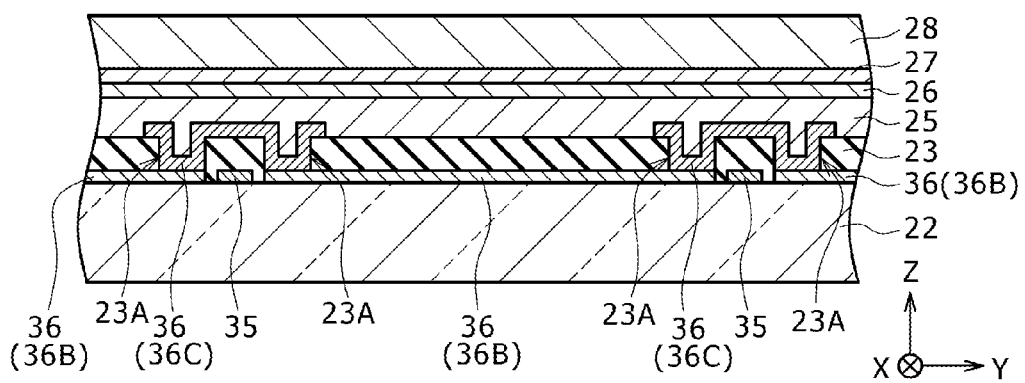
Figure 5:
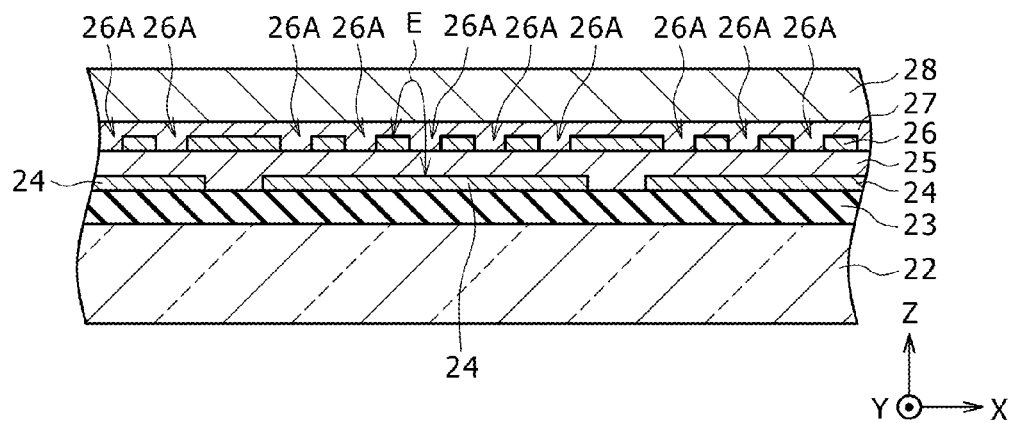
FIG. 5 is a fragmentary cross-sectional view taken along line C-C of FIG. 2.

Structural details of the area α (see FIG. 1) in the display device 1 will be described below. As described above, the area α covers a pixel and a nearby region in the display device 1. FIG. 4A is a fragmentary cross-sectional view taken along line A-A of FIG. 2, showing a portion corresponding to the area α in the display device 1, and FIG. 4B is a fragmentary cross-sectional view taken along line B-B of FIG. 2, showing a portion corresponding to the area α in the display device 1. FIG. 5 is a fragmentary cross-sectional view taken along line C-C of FIG. 2, showing a portion corresponding to the area α in the display device 1.

The lower panel substrate 20A has gate lines 35 disposed on the translucent substrate 22 and extending in the X-axis direction. The lower panel substrate 20A also has source lines 36 extending in a direction across the gate lines 35, e.g., in the Y-axis direction perpendicular to the gate lines 35. The source lines 36 are a specific example of "signal lines" according to the present disclosure.

The source lines 36 include portions, i.e., partial source lines 36B, other than their portions that extend across the gate lines 35, and the partial source lines 36B are disposed on the same surface as the gate lines 35, or specifically on the upper surface of the translucent substrate 22. The partial source lines 36B are a specific example of "partial signal lines" according to the present disclosure. The portions, i.e., bridge lines 36C, of the source lines 36 that extend across the gate lines 35 are disposed in positions facing the gate lines 35 with the insulating film 23 interposed therebetween. The bridge lines 36C are a specific example of "junctions" according to the present disclosure. According to the present exemplary embodiment, as described later, the bridge lines 36C are formed in a step different from the partial source lines 36B, and two adjacent partial source lines 36B are electrically connected to each other by a gate line 35.

The lower panel substrate 20A has TFT devices 37 aligned with the crossing regions of the gate lines 35 and the source lines 36. Each of the TFT devices 37, which is a type of FET (Field Effect Transistor), is in the form of a channel-etched amorphous silicon TFT having a bottom gate structure and a single gate structure. Each of the TFT devices 37 includes a gate electrode, not shown, the gate insulating film 23, a semiconductor film, not shown, of a-Si (amorphous silicon), an $N^+$—Si film, not shown, formed on the opposite ends of the semiconductor film by doping them with phosphorus, a source electrode 36A, and a drain electrode 24A. Each of the TFT devices 37 may alternatively be of a top gate structure.

The drain electrode 24A has a function as a connection terminal and has an end connected to the semiconductor film through the $N^+$—Si film. The pixel electrode 24 has a portion stacked on the other end of the drain electrode 24A, so that the drain electrode 24A and the pixel electrode 24 are electrically connected to each other. As shown in FIG. 2, the source electrode 36A is branched from the source line 36. The gate electrode is provided by a portion of the gate line 35, and extends across the source electrode 36A that is branched from the source line 36.

The driver circuit will be described below. The driver circuit energizes the light source of the backlight 10 to emit light from the light source as planar light through the upper surface of the backlight 10. The light is supplied through the pixels in the lower panel substrate 20A to the liquid crystal layer 28. While the light is being supplied to the liquid crystal layer 28, the driver circuit successively selects the gate lines 35, applies a signal voltage corresponding to a video signal to the source lines 36, and applies a predetermined reference voltage to the common electrode 26. The driver circuit thus applies predetermined voltages between the pixel electrodes 24 and the common electrode 26 to control the distribution of light from the liquid crystal molecules in the liquid crystal layer 28 for the pixels.

The pixel electrodes 24 are disposed in a regular pattern at positions beneath the common electrode 26 in alignment with the respective openings 26A of the common electrode 26, and disposed facing to the openings 26A in the lamination direction. When predetermined voltages are applied between the pixel electrodes 24 and the common electrode 26, a horizontal electric field is developed in portions of the liquid crystal layer 28 directly above the openings 26A, and a horizontal oblique electric field E (see FIG. 5) is developed in portions of the liquid crystal layer 28 other than the portions directly above the openings 26A, i.e., in portions directly above the portions of the common electrode 26 other than the openings 26A. The driver circuit realizes an FFS mode by applying predetermined voltages between the pixel electrodes 24 and the common electrode 26.

A process of manufacturing the lower panel substrate 20A included in the liquid crystal panel 10 will be described by way of example below. FIGS. 6A, 6B through 11A, 11B are fragmentary cross-sectional views illustrative of fabrication steps for fabricating the lower panel substrate 20A. FIGS. 6A, 7A, 8A, 9A, 10A, and 11A correspond to FIG. 4A taken along line A-A of FIG. 2, and FIGS. 6B, 7B, 8B, 9B, 10B, and 11B correspond to FIG. 4B taken along line B-B of FIG. 2.

Figure 6A:
FIGS. 6A and 6B are fragmentary cross-sectional views illustrative of a fabrication step for fabricating a lower panel of the display device shown in FIG. 1.
Figure 6B:
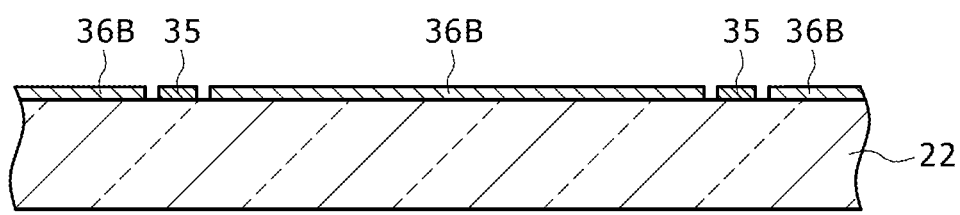
Figure 7A:
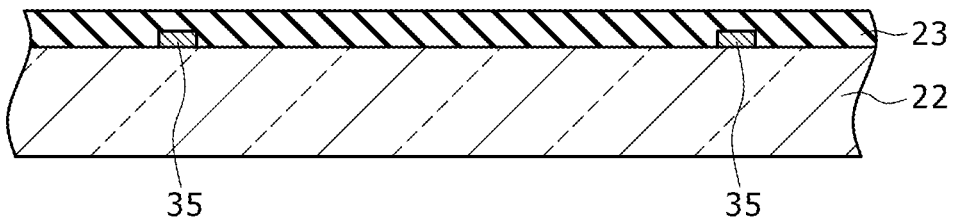
FIGS. 7A and 7B are fragmentary cross-sectional views illustrative of a fabrication step subsequent to the fabrication step shown in FIGS. 6A and 6B.
Figure 7B:
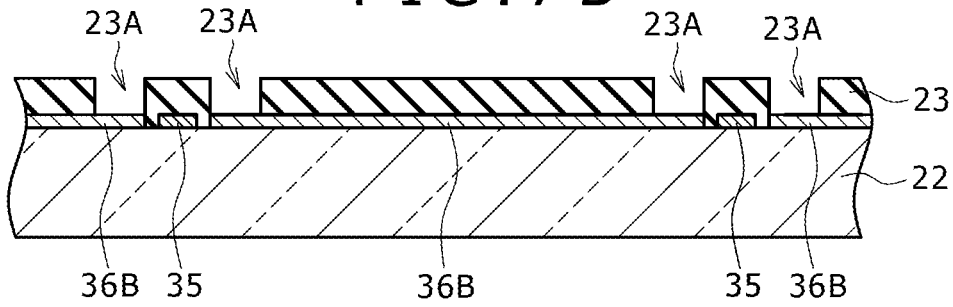
Figure 8A:
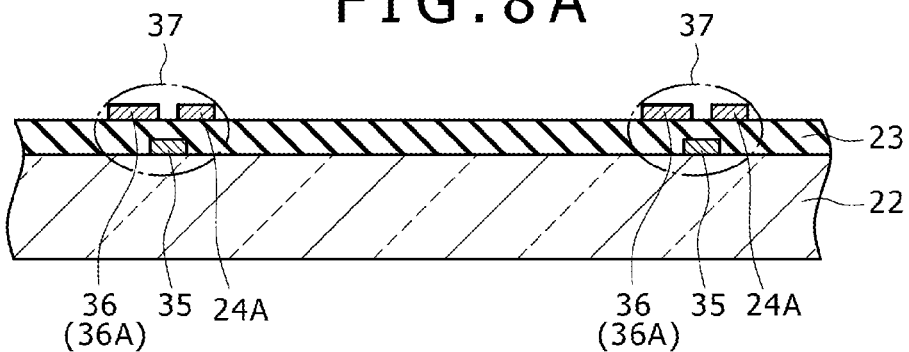
FIGS. 8A and 8B are fragmentary cross-sectional views illustrative of a fabrication step subsequent to the fabrication step shown in FIGS. 7A and 7B.
Figure 8B:
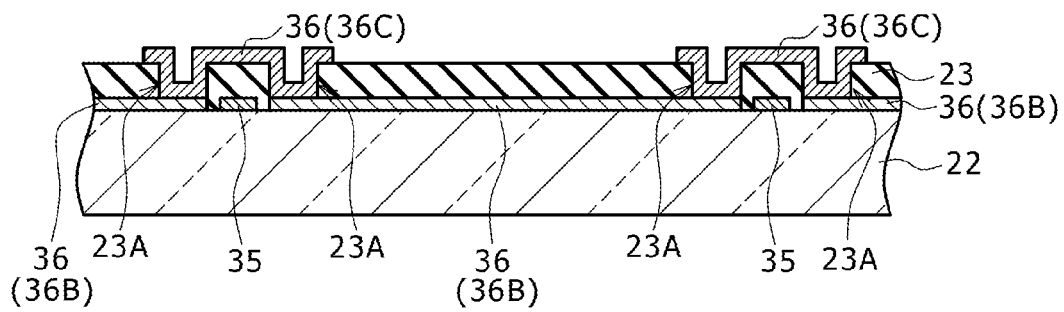

First, the gate lines 35 and the partial source lines 36B are formed on the translucent substrate 22 (FIGS. 6A and 6B). Then, the insulating film 23 is formed on the entire surface of the translucent substrate 22 including the gate lines 35 and the partial source lines 36B. Thereafter, the openings 23A are formed in the insulating film 23, exposing portions of the partial source lines 36B which are close to the gate lines 35 (FIGS. 7A and 7B). The bridge lines 36C are formed across the openings 23A to connect the adjacent partial source lines 36B (FIGS. 8A and 8B). The source lines 36 are thus formed. At the same time that the source lines 36 are formed, the source electrodes 36A held in contact with the bridge lines 36C and the drain electrodes 24A separate from the source electrodes 36A are formed on the insulating film 23 (FIGS. 8A and 8B). At this time, a semiconductor film, not shown, of a-Si (amorphous silicon), and an N$^+$—Si film, not shown, formed on the opposite ends of the semiconductor film by doping them with phosphorus are formed between the insulating film 23, and the source electrodes 36A and the drain electrodes 24A. The TFT devices 37 are thus formed in the crossing regions of the gate lines 35 and the source lines 36.

Figure 9A:
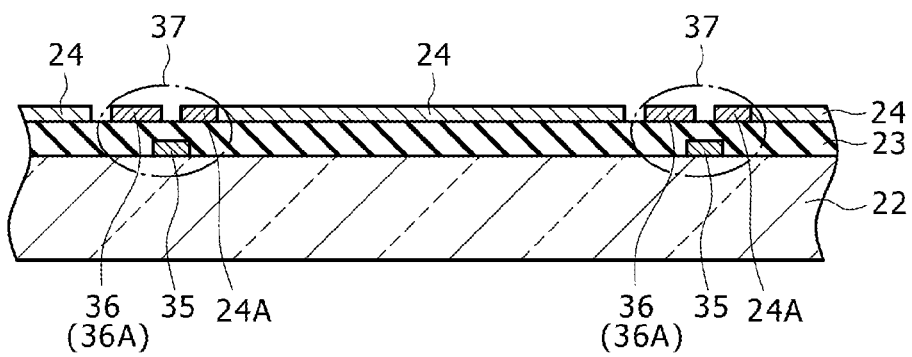
FIGS. 9A and 9B are fragmentary cross-sectional views illustrative of a fabrication step subsequent to the fabrication step shown in FIGS. 8A and 8B.
Figure 9B:
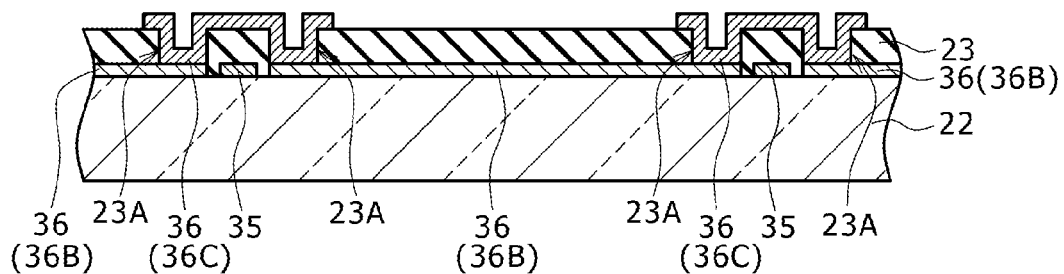
Figure 10A:
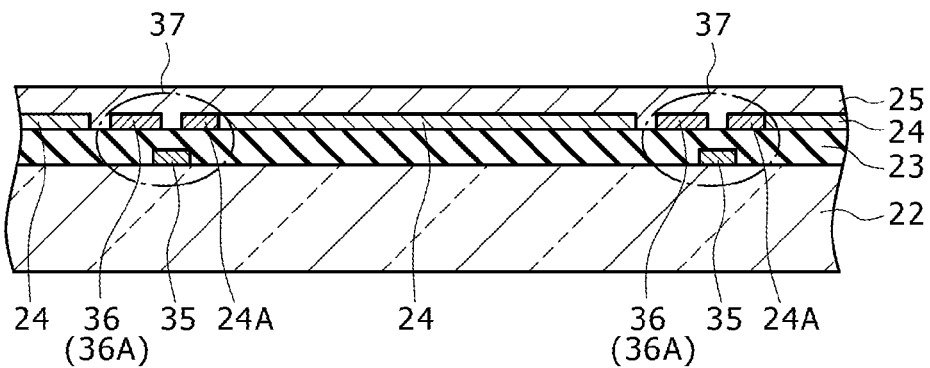
FIGS. 10A and 10B are fragmentary cross-sectional views illustrative of a fabrication step subsequent to the fabrication step shown in FIGS. 9A and 9B.
Figure 10B:
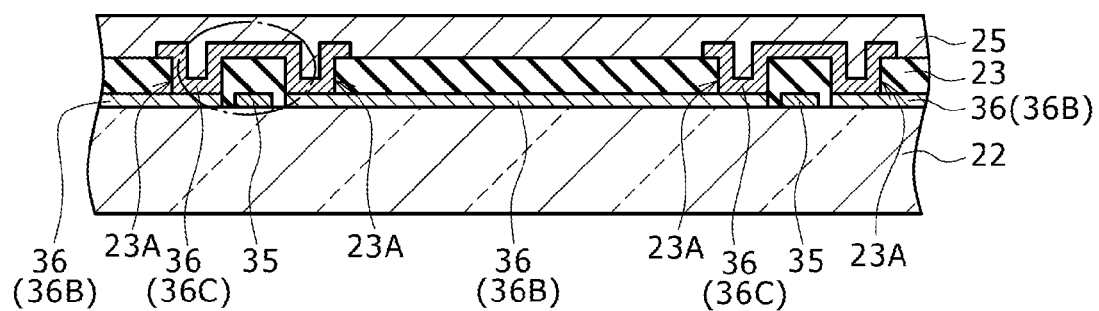
Figure 11A:
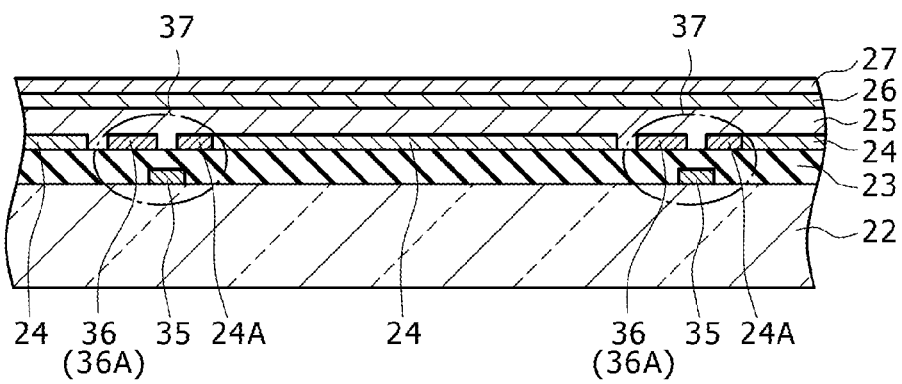
FIGS. 11A and 11B are fragmentary cross-sectional views illustrative of a fabrication step subsequent to the fabrication step shown in FIGS. 10A and 10B.
Figure 11B:
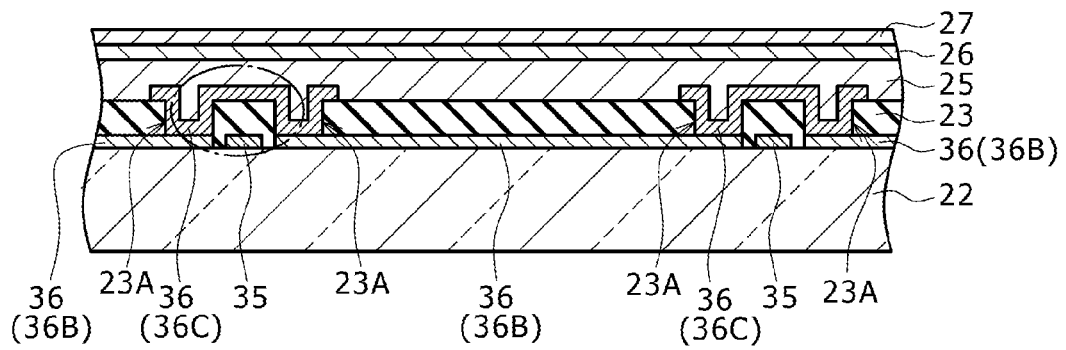

Then, the pixel electrodes 24 are formed in surface areas of the upper surface of the insulating film 23 which are surrounded by the gate lines 35 and the source lines 36 (FIGS. 9A and 9B). At this time, portions of the pixel electrodes 24 are placed on the drain electrodes 24A, so that the pixel electrodes 24 and the drain electrodes 24A are electrically connected to each other. Then, the protective film 25 is formed in covering relation to the source electrodes 36A, the drain electrodes 24A, and the pixel electrodes 24 (FIGS. 10A and 10B). After the common electrode 26 is formed on the entire surface formed so far, the openings 26A are formed in the areas of the common electrode 26 which face the pixel electrodes 24 (FIGS. 11A and 11B). Finally, the orientation film 27 is formed on the entire surface formed so far (FIGS. 11A and 11B). In this manner, the lower panel substrate 20A according to the present exemplary embodiment is manufactured.

Operation and advantages of the display device 1 according to the present exemplary embodiment will be described below.

When the display device 1 according to the present exemplary embodiment is in operation, the light source of the backlight 10 is energized, and light from the light source is emitted as planar light through the upper surface of the backlight 10 and applied to the rear surface of the liquid crystal panel 20. While the light is being supplied through the pixels in the lower panel substrate 20A to the liquid crystal layer 28, the driver circuit successively selects the gate lines 35, applies a signal voltage corresponding to a video signal to the source lines 36, and applies a predetermined reference voltage to the common electrode 26, thereby applying voltages between the pixel electrodes 24 and the common electrode 26 to control the distribution of light from the liquid crystal molecules in the liquid crystal layer 28 for the pixels, thereby outputting image light $L_1$ from the video display surface 1A.

The pixel electrodes 24 are disposed in a regular pattern at positions beneath the common electrode 26 in alignment with the respective openings 26A of the common electrode 26, and disposed facing to the openings 26A in the lamination direction. When voltages are applied between the pixel electrodes 24 and the common electrode 26, a horizontal electric field is developed in portions of the liquid crystal layer 28 directly above the openings 26A, and a horizontal oblique electric field E (see FIG. 5) is developed in portions of the liquid crystal layer 28 other than the portions directly above the openings 26A, i.e., in portions directly above the portions of the common electrode 26 other than the openings 26A. As a result, an FFS mode is realized for a wide viewing angle and a high aperture ratio.

According to the present exemplary embodiment, the portions, i.e., partial source lines 36B, of the source lines 36 other than their portions that extend across the gate lines 35, and the pixel electrodes 24 are disposed on different surfaces. Specifically, as shown in FIGS. 4A and 4B, the partial source lines 36B are formed on the surface of the translucent substrate 22, and the pixel electrodes 24 are formed on the surface of the insulating film 23. Therefore, the partial source lines 36B and the common electrode 26 can be spaced away from each other by increasing the thickness of the insulating film 23, and the pixel electrodes 24 and the common electrode 26 can be brought closely to each other by reducing the thickness of the protective film 25. In other words, according to the present exemplary embodiment, the distance between the partial source lines 36B and the common electrode 26 and the distance between the pixel electrodes 24 and the common electrode 26 can be adjusted independently of each other. As a consequence, it is possible to reduce the interconnect capacitance developed between the source lines 36 and the common electrode 26, and at the same time to reduce the voltage required to drive the pixel electrodes 24. The display device 1 is thus of low power consumption.

2. Modifications:

1st Modification:

In the above exemplary embodiment, the partial source lines 36B and the bridge lines 36C of the source lines 36 are formed in different steps. However, they may be formed altogether in one step.

Figure 12A:
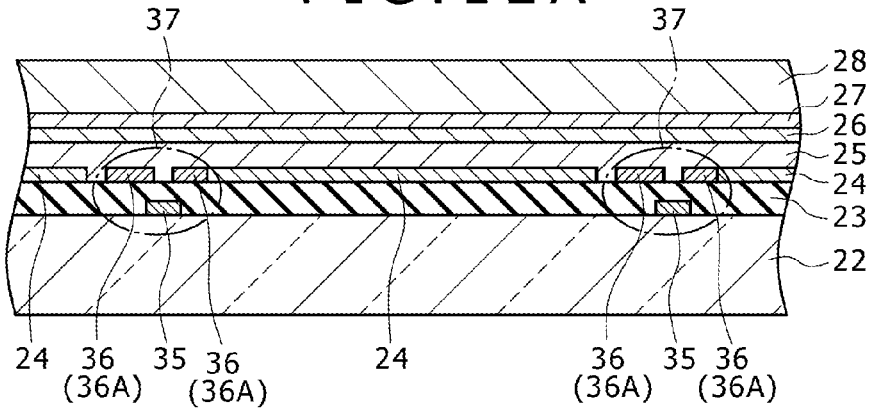
FIGS. 12A and 12B are fragmentary cross-sectional views showing another configurational example of the display device according to the embodiment of the present disclosure, the views corresponding to FIGS. 4A and 4B taken along lines A-A and B-B, respectively, of FIG. 2.
Figure 12B:
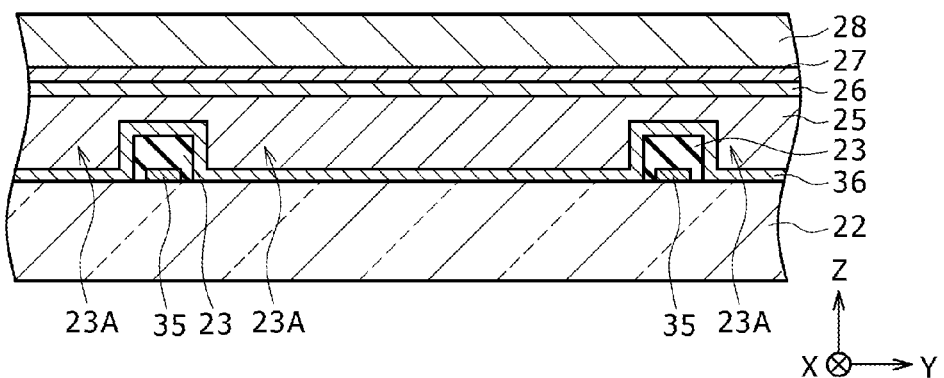
Figure 13:
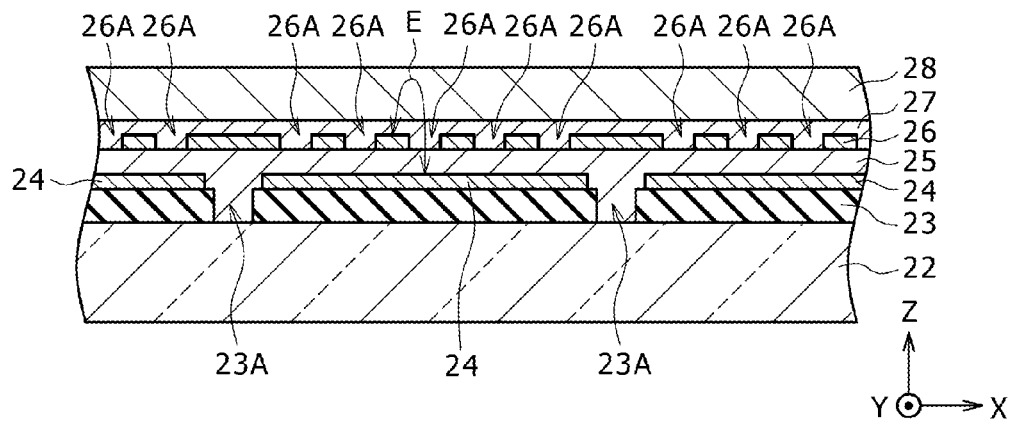
FIG. 13 is a fragmentary cross-sectional view showing the other configurational example of the display device shown in FIGS. 12A and 12B, the view corresponding to FIG. 5 taken along line C-C of FIG. 2.

FIG. 12A shows a sectional configurational example of a display device 1 according to the present modification, the view corresponding to FIG. 4A taken along line A-A of FIG. 2, and FIG. 12B shows a sectional configurational example of the display device 1 according to the present modification, the view corresponding to FIG. 4B taken along line B-B of FIG. 2. FIG. 13 shows a sectional configurational example of the display device 1 according to the present modification, the view corresponding to FIG. 5 taken along line C-C of FIG. 2.

As shown in FIGS. 12A and 12B, and 13, the insulating film 23 has openings 23A defined in striped areas thereof which face the source lines 36, other than the areas which face the gate lines 35. The source lines 36 extend continuously from the bottoms of the openings 23A, i.e., the surface of the translucent substrate 22, to the surface of portions of the insulating film 23 which are directly above the gate lines 35. In other words, the portions of the source lines 36 other than their portions that extend across the gate lines 35 are formed on the bottoms of the openings 23A, i.e., the surface of the translucent substrate 22, and the portions of the source lines 36 that extend across the gate lines 35 are formed on the insulating film 23. The protective film 25 is formed to fill the openings 23A in covering relation to the source lines 36, the drain electrodes 24A, and the pixel electrodes 24.

A process of manufacturing the lower panel substrate 20A according to the present modification will be described by way of example below. FIGS. 14A and 14B through 19A and 19B are fragmentary cross-sectional views illustrative of fabrication steps for fabricating the lower panel substrate 20A according to the present modification. FIGS. 14A, 15A, 16A, 17A, 18A, and 19A each showing an example of a sectional configuration correspond to FIG. 4A taken along line A-A of FIG. 2, and FIGS. 14B, 15B, 16B, 17B, 18B, and 19B each showing a sectional configuration correspond to FIG. 4B taken along line B-B of FIG. 2 in the display device 1 according to the present modification.

Figure 14A:
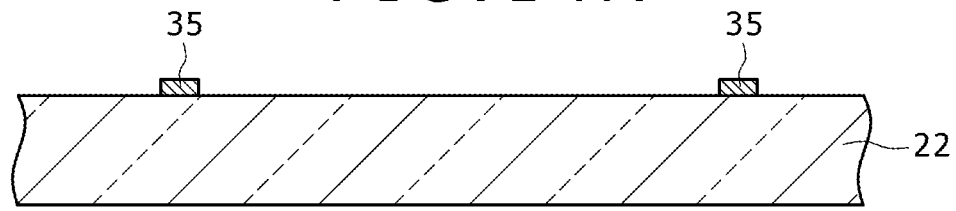
FIGS. 14A and 14B are fragmentary cross-sectional views illustrative of a fabrication step for fabricating a lower panel of the display device shown in FIGS. 12A and 12B.
Figure 14B:
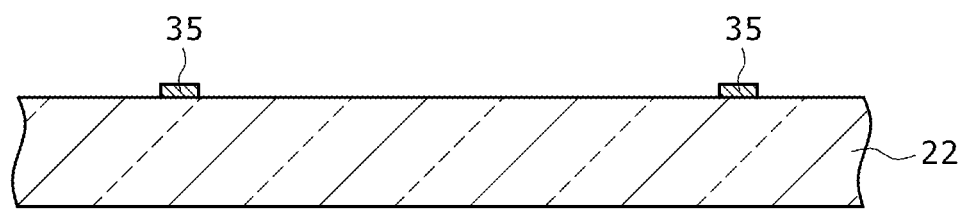
Figure 15A:
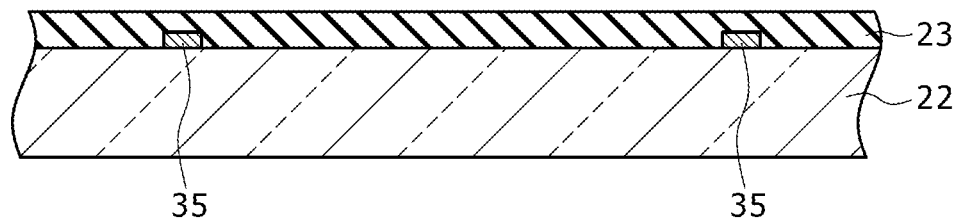
FIGS. 15A and 15B are fragmentary cross-sectional views illustrative of a fabrication step subsequent to the fabrication step shown in FIGS. 14A and 14B.
Figure 15B:
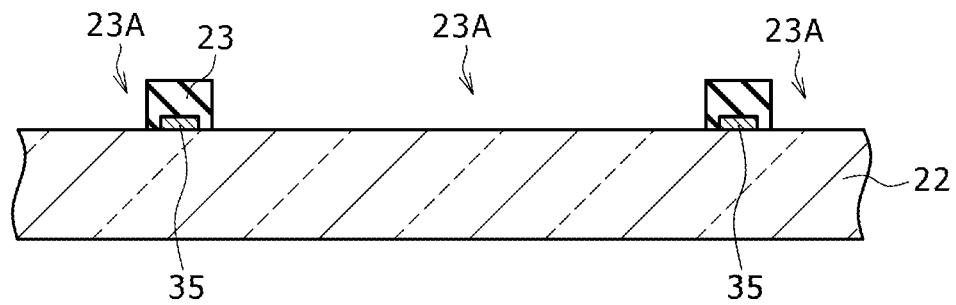
Figure 16A:
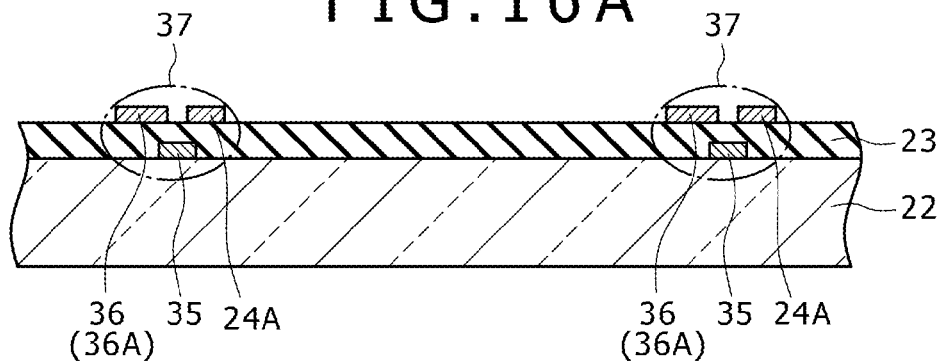
FIGS. 16A and 16B are fragmentary cross-sectional views illustrative of a fabrication step subsequent to the fabrication step shown in FIGS. 15A and 15B.
Figure 16B:
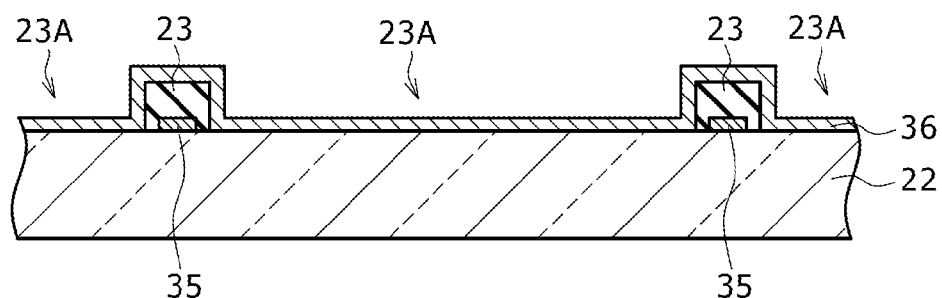

First, the gate lines 35 are formed on the translucent substrate 22 (FIGS. 14A and 14B). Then, the insulating film 23 is formed on the entire surface of the translucent substrate 22 including the gate lines 35. Thereafter, the openings 23A are formed in the insulating film 23, exposing the surface of the translucent substrate 22, in striped areas which will form the source lines 36 other than other than their portions that extend across the gate lines 35 (FIGS. 15A and 15B). Then, the source lines 36 are formed so as to extend continuously from the bottoms of the openings 23A, i.e., the surface of the translucent substrate 22, to the surface of portions of the insulating film 23 which face the gate lines 35, i.e., which are directly above the gate lines 35 (FIGS. 16A and 16B). In this manner, the source lines 36 are formed altogether in one step. At the same time that the source lines 36 are formed, the source electrodes 36A held in contact with the source lines 36 and the drain electrodes 24A separate from the source electrodes 36A are formed on the insulating film 23 (FIGS. 16A and 16B). At this time, a semiconductor film, not shown, of a-Si (amorphous silicon), and an $N^+$—Si film, not shown, formed on the opposite ends of the semiconductor film by doping them with phosphorus are formed between the insulating film 23, and the source electrodes 36A and the drain electrodes 24A. The TFT devices 37 are thus formed in the crossing regions of the gate lines 35 and the source lines 36.

Figure 17A:
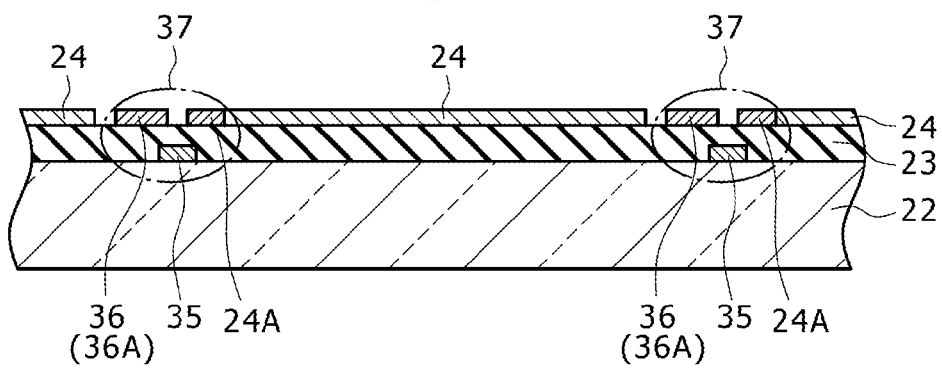
FIGS. 17A and 17B are fragmentary cross-sectional views illustrative of a fabrication step subsequent to the fabrication step shown in FIGS. 16A and 16B.
Figure 17B:
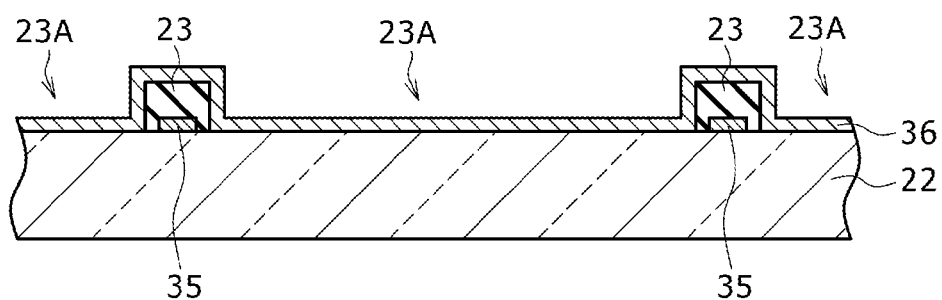
Figure 18A:
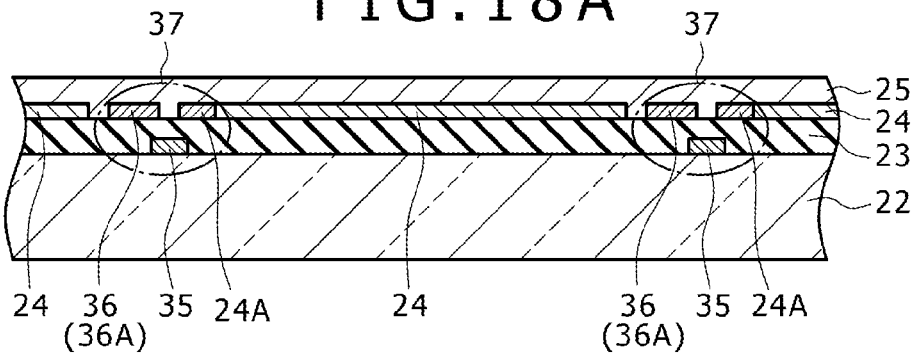
FIGS. 18A and 18B are fragmentary cross-sectional views illustrative of a fabrication step subsequent to the fabrication step shown in FIGS. 17A and 17B.
Figure 18B:
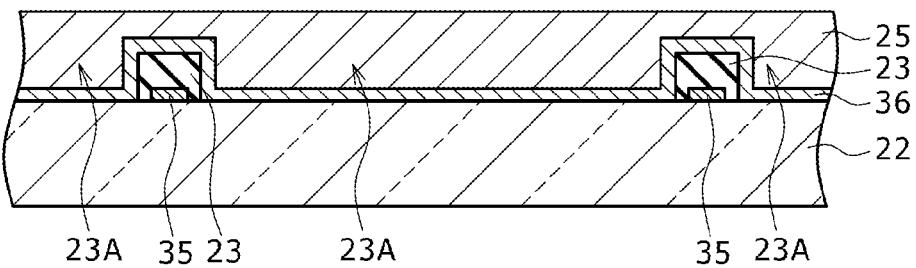
Figure 19A:
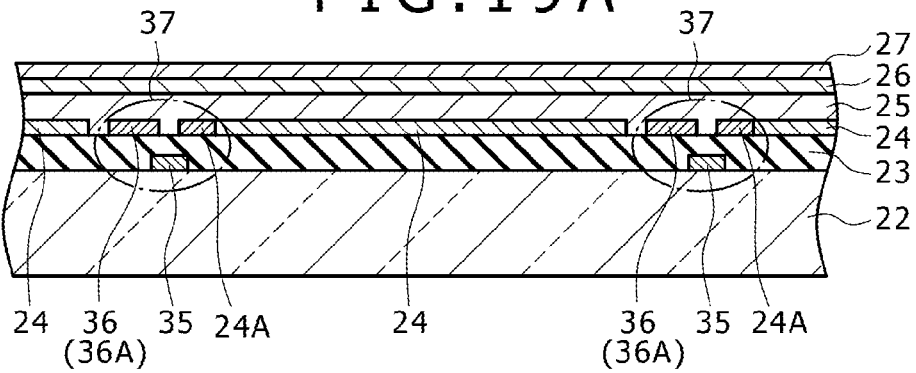
FIGS. 19A and 19B are fragmentary cross-sectional views illustrative of a fabrication step subsequent to the fabrication step shown in FIGS. 18A and 18B.
Figure 19B:
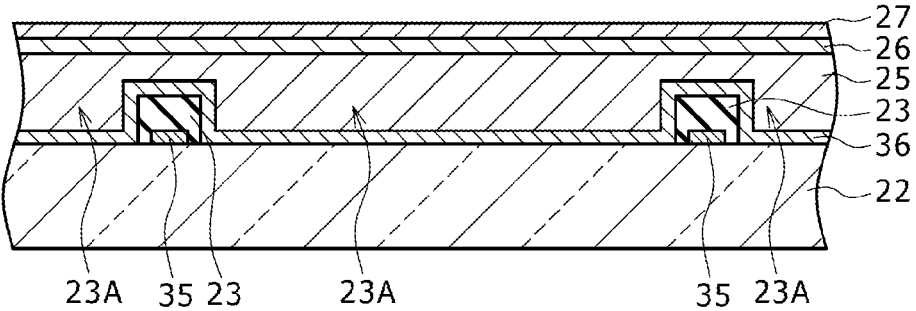

Then, the pixel electrodes 24 are formed in surface areas of the upper surface of the insulating film 23 which are surrounded by the gate lines 35 and the source lines 36 (FIGS. 17A and 17B). At this time, portions of the pixel electrodes 24 are placed on the drain electrodes 24A, so that the pixel electrodes 24 and the drain electrodes 24A are electrically connected to each other. Then, the protective film 25 is formed in covering relation to the source electrodes 36A, the drain electrodes 24A, and the pixel electrodes 24 (FIGS. 18A and 18B). At this time, the source lines 36 are embedded and the protective film 25 is formed so as to fill the openings 23A. After the common electrode 26 is formed on the entire surface formed so far, the openings 26A are formed in the areas of the common electrode 26 which face the pixel electrodes 24 (FIGS. 19A and 19B). Finally, the orientation film 27 is formed on the entire surface formed so far (FIGS. 19A and 19B). In this manner, the lower panel substrate 20A according to the present modification is manufactured.

According to the present modification, as with the above exemplary embodiment, the portions of the source lines 36 other than their portions that extend across the gate lines 35, and the pixel electrodes 24 are disposed on different surfaces. Therefore, according to the present modification, the partial source lines 36B and the common electrode 26 can be spaced away from each other by increasing the thickness of the insulating film 23, and the pixel electrodes 24 and the common electrode 26 can be brought closely to each other by reducing the thickness of the protective film 25. In other words, according to the present modification, the distance between the partial source lines 36B and the common electrode 26 and the distance between the pixel electrodes 24 and the common electrode 26 can be adjusted independently of each other. As a consequence, it is possible to reduce the interconnect capacitance developed between the source lines 36 and the common electrode 26, and at the same time to reduce the voltage required to drive the pixel electrodes 24. According to the present modification, the display device 1 is thus of low power consumption.

2nd Modification:

In the above exemplary embodiment and its modification, the display device 1 includes an FFS-mode liquid crystal panel as a display panel. Alternatively, the device 1 may include an ISP-mode liquid crystal panel as a display panel. In the above exemplary embodiment and its modification, the portions of the source lines 36 other than their portions that extend across the gate lines 35 are formed on the surface of the translucent substrate 22, and the pixel electrodes 24 are formed on the insulating film 23. However, they may be formed on surfaces different from those described above insofar as the portions of the source lines 36 other than their portions that extend across the gate lines 35 and the pixel electrodes 24 are formed on different surfaces. The internal structural details of the lower panel substrate 20A are not limited to those according to the above exemplary embodiment and its modification. Components to be described below are denoted by reference characters which are identical to those used in the above exemplary embodiment and its modification. However, those identical reference characters should not be interpreted as suggesting that the positions of the components in the lower panel substrate 20A are limited to the positions in the above exemplary embodiment and its modification.

Figure 20:
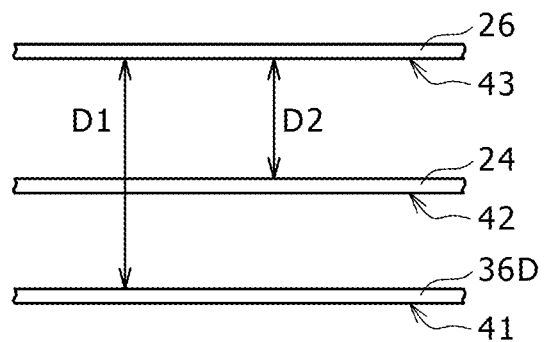
FIG. 20 is a schematic view showing a modification of the display device shown in FIGS. 1, 12A and 12B.
Figure 21:
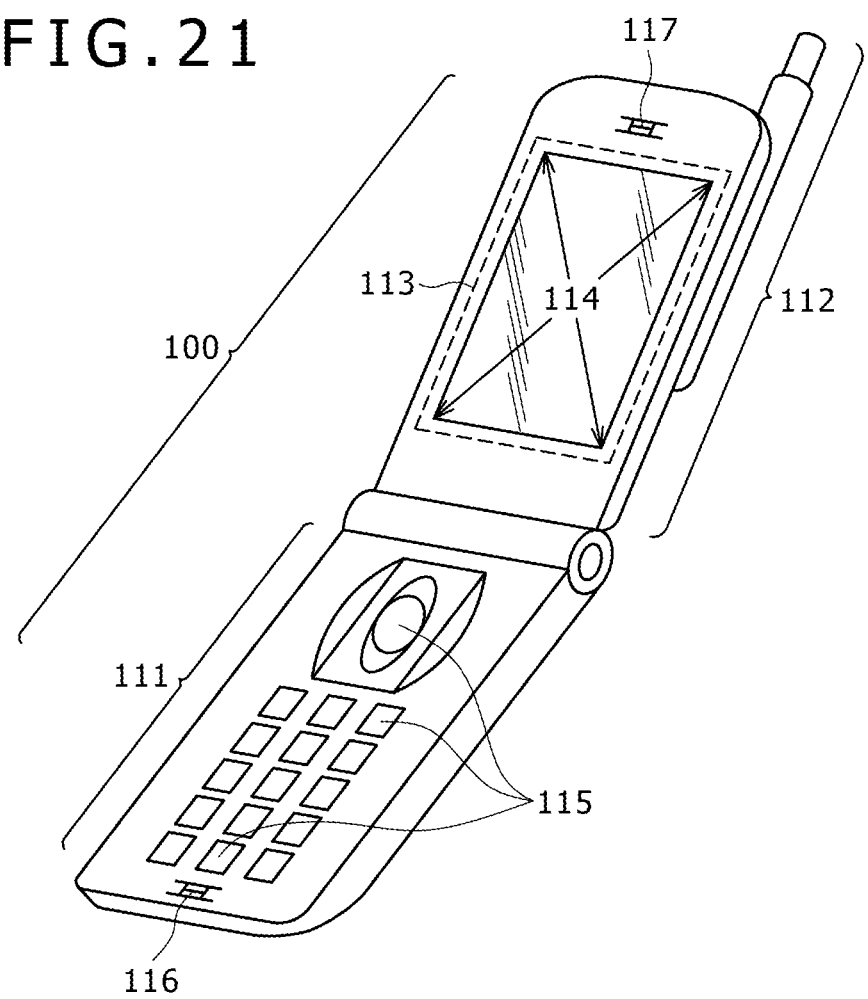
FIG. 21 is a perspective view showing a configurational example of an electronic apparatus according to an application of the present disclosure.

For example, as shown in FIG. 20, portions (partial source lines 36D) of the source lines 36 other than their portions that extend across the gate lines 35 are formed on a first surface 41 in the lower panel substrate 20A. Furthermore, as shown in FIG. 20, within the lower panel substrate 20A, the pixel electrodes 24 are formed on a second surface 42 which is closer to the liquid crystal layer 28 than the first surface 41, and the common electrode 26 is formed on a third surface 43 which is closer to the liquid crystal layer 28 than the second surface 42. The distance D1 between the partial source lines 36D and the common electrode 26 and the distance D2 between the pixel electrodes 24 and the common electrode 26 can be adjusted independently of each other. The distance D1 is of 600 nm (6000 angstrom) or greater, and the distance D2 is in the range from 200 nm (2000 angstrom) to 400 nm (4000 angstrom). Since the distances D1, D2 are in the above ranges, it is possible to reduce the interconnect capacitance developed between the source lines 36 and the common electrode 26, and at the same time to reduce the voltage required to drive the pixel electrodes 24. According to the present modification, the display device 1 is thus of low power consumption.

3. Application:

An application of the display devices 1 according to the above exemplary embodiment and its modifications will be described below.

FIG. 21 is a perspective view showing a configurational example of an electronic apparatus 100 according to an application of the present disclosure. The electronic apparatus 100 is in the form of a mobile phone, and includes, as shown in FIG. 21, a main body 111 and a display body 112 that is openably and closably connected to the main body 111. The main body 111 includes operation buttons 115 and a microphone 116. The display body 112 includes a display device 113 and an earphone 117. The display device 113 displays various items of information about telephone communications on a display screen 114 thereof The electronic apparatus 100 includes a controller, not shown, for controlling operation of the display device 113. The controller is disposed in the main body 111 or the display body 112 as part of a control system for controlling operation of the electronic apparatus 100 or separately from such a control system.

The display device 113 is identical in structure to the display devices 1 according to the above exemplary embodiment and its modifications. Therefore, in the display device 113, the interconnect capacitance developed between the source lines 36 and the common electrode 26 is reduced, and at the same time the voltage required to drive the pixel electrodes 24 is reduced. The electronic apparatus 100 is thus of low power consumption.

Electronic apparatuses to which the display devices 1 according to the above exemplary embodiment and its modifications are applicable include, in addition to the mobile phone described above, a personal computer, a liquid crystal television set, a viewfinder or direct-view-monitor video tape recorder, a car navigation device, a pager, an electronic organizer, an electronic calculator, a word processor, a work station, a video phone, a point of sales terminal, etc.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A display panel comprising:
gate lines disposed on a first substrate;
signal lines extending across said gate lines and including portions, other than portions thereof that extend across said gate lines, disposed on the same surface as said gate lines, said portions that extend across said gate lines being disposed in positions facing said gate lines with an insulating film interposed therebetween;
transistors having gate electrodes connected to said gate lines, source electrodes connected to said signal lines and disposed on said insulating film, and drain electrodes disposed on said insulating film;
pixel electrodes connected to said drain electrode and disposed on said insulating film;
a protective film covering said transistors and said pixel electrodes, wherein the thickness of the protective film is the same as or smaller than the thickness of the insulating film; and
a common electrode disposed on said protective film, wherein a spacing between said common electrode and said signal lines is determined by the thickness of the protective film and the thickness of the insulating film.

2. The display panel according to claim 1, wherein said pixel electrodes and said common electrode are translucent.

3. The display panel according to claim 2, wherein said common electrode is disposed in a planar pattern fully over a display area provided by said pixel electrodes.

4. The display panel according to claim 3, wherein said common electrode has a plurality of openings defined in areas thereof which face said pixel electrodes, respectively.

5. The display panel according to claim 1, further comprising:
a first orientation film disposed on said common electrode;
a second orientation film disposed on a surface of a second substrate which faces said first substrate, said second substrate being spaced from said first substrate by a predetermined distance and disposed in confronting relation to said first substrate; and
a liquid crystal layer disposed between said first orientation film and said second orientation film.

6. A display device comprising:
a display panel as a display unit;
said display panel including:
gate lines disposed on a first substrate,
signal lines extending across said gate lines and including portions, other than portions thereof that extend across said gate lines, disposed on the same surface as said gate lines, said portions that extend across said gate lines being disposed in positions facing said gate lines with an insulating film interposed therebetween,
transistors having gate electrodes connected to said gate lines, source electrodes connected to said signal lines and disposed on said insulating film, and drain electrodes disposed on said insulating film;
pixel electrodes connected to said drain electrode and disposed on said insulating film;
a protective film covering said transistors and said pixel electrodes, wherein the thickness of the protective film is the same as or smaller than the thickness of the insulating film; and
a common electrode disposed on said protective film, wherein a spacing between said common electrode and said signal lines is determined by the thickness of the protective film and the thickness of the insulating film.

7. An electronic apparatus comprising:
a display device;
said display device including a display panel as a display unit;
said display panel including:
gate lines disposed on a first substrate;
signal lines extending across said gate lines and including portions, other than portions thereof that extend across said gate lines, disposed on the same surface as said gate lines, said portions that extend across said gate lines being disposed in positions facing said gate lines with an insulating film interposed therebetween,
transistors having gate electrodes connected to said gate lines, source electrodes connected to said signal lines and disposed on said insulating film, and drain electrodes disposed on said insulating film;
pixel electrodes connected to said drain electrode and disposed on said insulating film;
a protective film covering said transistors and said pixel electrodes, wherein the thickness of the protective film is the same as or smaller than the thickness of the insulating film; and
a common electrode disposed on said protective film, wherein a spacing between said common electrode and said signal lines is determined by the thickness of the protective film and the thickness of the insulating film.

8. The display device of claim 6, wherein said pixel electrodes and said common electrode are translucent.

9. The display device of claim 8, wherein said common electrode is disposed in a planar pattern fully over a display area provided by said pixel electrodes.

10. The display device of claim 9, wherein said common electrode has a plurality of openings defined in areas thereof which face said pixel electrodes, respectively.

11. The display device of claim 6, further comprising:
a first orientation film disposed on said common electrode;
a second orientation film disposed on a surface of a second substrate which faces said first substrate, said second substrate being spaced from said first substrate by a predetermined distance and disposed in confronting relation to said first substrate; and a liquid crystal layer disposed between said first orientation film and said second orientation film.

12. The electronic apparatus of claim 7, wherein said pixel electrodes and said common electrode are translucent.

13. The electronic apparatus of claim 12, wherein said common electrode is disposed in a planar pattern fully over a display area provided by said pixel electrodes.

14. The electronic apparatus of claim 13, wherein said common electrode has a plurality of openings defined in areas thereof which face said pixel electrodes, respectively.

15. The electronic apparatus of claim 7, further comprising:
   a first orientation film disposed on said common electrode;
   a second orientation film disposed on a surface of a second substrate which faces said first substrate, said second substrate being spaced from said first substrate by a predetermined distance and disposed in confronting relation to said first substrate; and a liquid crystal layer disposed between said first orientation film and said second orientation film.

16. The display panel according to claim 1, wherein a distance between said common electrode and said signal lines can be adjusted independently of a distance between said common electrode and said pixel electrodes.

17. The display device of claim 6, wherein a distance between said common electrode and said signal lines can be adjusted independently of a distance between said common electrode and said pixel electrodes.

18. The electronic apparatus of claim 7, wherein a distance between said common electrode and said signal lines can be adjusted independently of a distance between said common electrode and said pixel electrodes.

* * * * *